United States Patent
Egitto et al.

(10) Patent No.: US 6,770,968 B2
(45) Date of Patent: Aug. 3, 2004

(54) METHOD FOR BONDING HEAT SINKS TO OVERMOLDS AND DEVICE FORMED THEREBY

(75) Inventors: Frank D. Egitto, Binghamton, NY (US); Michael A. Gaynes, Vestal, NY (US); Ramesh R. Kodnani, Binghamton, NY (US); Luis J. Matienzo, Endicott, NY (US); Mark V. Pierson, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/369,778

(22) Filed: Feb. 19, 2003

(65) Prior Publication Data

US 2003/0123229 A1 Jul. 3, 2003

Related U.S. Application Data

(62) Division of application No. 09/757,159, filed on Jan. 9, 2001, now Pat. No. 6,576,996, which is a division of application No. 09/248,341, filed on Feb. 11, 1999, now Pat. No. 6,206,997.

(51) Int. Cl.⁷ .............................................. H01L 23/34
(52) U.S. Cl. ........................ 257/707; 257/717; 438/122
(58) Field of Search ................................. 257/706, 707, 257/712, 717; 428/446; 438/122

(56) References Cited

U.S. PATENT DOCUMENTS

| | | |
|---|---|---|
| 4,611,389 A | 9/1986 | Blair et al. |
| 5,157,478 A | 10/1992 | Ueda et al. |
| 5,250,843 A | 10/1993 | Eichelberger |
| 5,311,060 A | 5/1994 | Rostoker et al. |
| 5,353,498 A | 10/1994 | Fillion et al. |
| 5,450,283 A | 9/1995 | Lin et al. |
| 5,497,033 A | 3/1996 | Fillion et al. |
| 5,525,834 A | 6/1996 | Fischer et al. |
| 5,592,735 A | 1/1997 | Ozawa et al. |
| 5,672,548 A | 9/1997 | Culnane et al. |
| 5,879,794 A | 3/1999 | Korleski, Jr. |
| 5,938,854 A | 8/1999 | Roth |
| 6,719,871 B2 * | 4/2004 | Egitto et al. |

FOREIGN PATENT DOCUMENTS

| | | |
|---|---|---|
| JP | 60143650 | 7/1985 |
| JP | 09/53576 | 6/1997 |

* cited by examiner

*Primary Examiner*—Jeff H. Aftergut
*Assistant Examiner*—John T. Haran
(74) *Attorney, Agent, or Firm*—Schmeiser, Olsen & Watts; William H. Steinberg

(57) ABSTRACT

A method for bonding heat sinks to packaged electronic components comprises the steps of: (a) exposing to a plasma a surface of a molded polymer formed on a substrate; (b) allowing the plasma to at least partially convert silicon-containing residue on the surface to silica; and (c) bonding an article to the surface by applying an adherent between the article and the surface. Often, the silicon-containing residue is silicone oil, a mold release compound, which may prevent the formation of a bond when using conventional bonding methods and materials. The silica layer formed on the surface of the molded polymer assists in formation of a proper bond. The plasma may be an oxygen plasma and the adherent may be selected from either a heat cured silicone-based paste adhesive with a metal oxide filler or a heat cured porous polymer film impregnated with adhesive. In particular, the film may be polytetrafluoroethylene, the adhesive may be polybutadine, and the film may be further impregnated with a metal oxide heat transfer medium, such as zinc oxide. An alternate method comprises applying the porous polymer film without plasma treatment and heat curing the film to form a proper bond.

8 Claims, 1 Drawing Sheet

METHOD FOR BONDING HEAT SINKS TO OVERMOLDS AND DEVICE FORMED THEREBY

This application is a divisional of Ser. No. 09/757,159; filed on Jan. 9, 2001; now U.S. Pat. No. 6,576,996; which is a divisional of 09/248,341 filed Feb. 11, 1999 U.S. Pat. No. 6,206,997, issued on Mar. 27, 2001.

BACKGROUND OF THE INVENTION

1. Technical Field

This invention relates to the bonding of articles to electronic component packages. More specifically, the invention relates to a method for bonding heat sinks to overmolds and a device formed thereby.

2. Background Art

Electronic components, such as semi-conductor devices, are used in increasing numbers in a wide variety of products. Generally, electronic components produce heat during operation. In some devices, the heat generated by an electronic component may build in the component, or in the device, and damage the component or other components in the device. Accordingly, there is often a need to dissipate the heat generated by electronic components to extend the life of devices using such components.

Several ways of dissipating heat generated from electronic components have been developed. One common method is to provide a fan in the device to blow air through the device and to vent the heat. Unfortunately, a fan cannot always be provided in a device using electronic components. Another way to increase heat dissipation from an electronic device involves increasing the surface area of the device. According to well recognized heat transfer principles, increasing the surface area will cause an increased transfer of heat from the electronic component to its surroundings. Unfortunately, it is generally desirable that electronic components be as small as possible and there is an increasing need to reduce the size of components while still providing sufficient heat dissipation. Yet another way to dissipate heat is to bond an electronic component to a heat sink. The purpose of a heat sink is to conduct heat away from the electronic device and then dissipate the heat from the heat sink. Heat sinks are typically made from a heat conductive material, such as metal, and aluminum is frequently used since it is light weight and readily available. Such heat sinks can easily be designed to conduct heat away from the electrical component while simultaneously providing a large surface area for heat dissipation. For example, the heat sink may include integral fins that provide a large surface area for a relatively small volume.

While heat sinks solve some of the problems of heat dissipation, there remains a current problem of bonding a heat sink to an electronic component. For the heat generated by the component to be transferred to the heat sink, a connection allowing heat conductance between the component and the heat sink must exist. Conventionally, heat sinks are mechanically attached to electronic components and a heat conducting thermal grease is placed between the component and the heat sink, thus, providing heat conductance as needed. Unfortunately, mechanical attachment with clips, rivets, or other devices possesses serious disadvantages. First, such mechanical attachments require thermal grease, clips, and/or rivets, and other materials, increasing the material cost of a unit with a heat sink. Second, the mechanical attachments increase the process costs. Third, such mechanical attachments have proven to possess poor long term reliability. In other words, either the conductive path between the component and heat sink is compromised or the mechanical attachment fails all together. In addition, devices such as rivets put stress on the electronic component and may cause failure of the component during thermal expansion and contraction.

One attempt at resolving the problem of mechanical attachment involves using adhesive to create a uniform bond between an electronic component and a heat sink. Unfortunately, many electronic components are made of substances or are packaged in substances to which it is very difficult to adhere a heat sink. For example, electronic components are often at least partially encapsulated in polymer compounds through injection molding or other molding processes. Typical adhesives that are expected to bond with polymer compounds will not bond a heat sink to some encapsulants. This problem has been encountered in the production of plastic ball grid array (PBGA) packages, in particular, PBGA packages with an overmold covering electronic components mounted on the PBGA.

Thus, there existed a need to provide a method for uniformly bonding heat sinks to electronic component encapsulants.

DISCLOSURE OF INVENTION

According to the present invention, a method for bonding is provided comprising the steps of exposing to a plasma a surface of a molded polymer formed on a substrate, allowing the plasma to at least partially convert silicon-containing residue on the surface to silica, and bonding an article to the surface by applying an adherent between the article and the surface. By way of example, the plasma may be an oxygen plasma. Also, the molded polymer may be an overmold, the substrate may be an electronic component, and the article may be a heat sink. Further, the step of bonding, for example, may include heat curing the adherent by preferentially driving heat through the article to avoid exposing the substrate to the curing temperature. One example of a suitable adherent is a silicone-based paste adhesive with a metal oxide filler.

The present invention provides another method for bonding comprising the steps of providing a molded polymer formed on a substrate, wherein the molded polymer has a surface with a silicon-containing residue thereon, bonding an article to the surface by applying a porous polymer film between the article and the surface, wherein the film is impregnated with adhesive, and heat curing the film. By way of example, the silicon-containing residue may be silicone oil, the film may be polytetrafluoroethylene, the adhesive may be polybutadine, and the film may be further impregnated with a metal oxide heat transfer medium.

The present invention also provides an apparatus comprising a molded polymer formed on substrate, a silica layer on a surface on the molded polymer, adherent bonded to the silica layer, and an article bonded to the adherent. The silica layer thus provides a surface on the molded polymer to which an adherent may be adequately bonded. Another apparatus comprises a molded polymer formed on a substrate, silicon-containing residue on a surface of the molded polymer, an adherent bonded to the surface, and an article bonded to the adherent. By way of example, the adherent may be a porous polymer film impregnated with the adhesive as described above. In each of the above two methods and two apparatus, the molded polymer may, for example, be an overmold, the substrate may be an electronic component, and the article may be a heat sink.

The foregoing and other features and advantages of the present invention will be apparent from the following more particular description of preferred embodiments of the invention, as illustrated in the accompanying drawing.

BRIEF DESCRIPTION OF DRAWINGS

Preferred embodiments of the present invention will hereinafter be described in conjunction with the appended drawings, where like designations denote like elements, and.

BEST MODE FOR CARRYING OUT THE INVENTION

Figure 1:
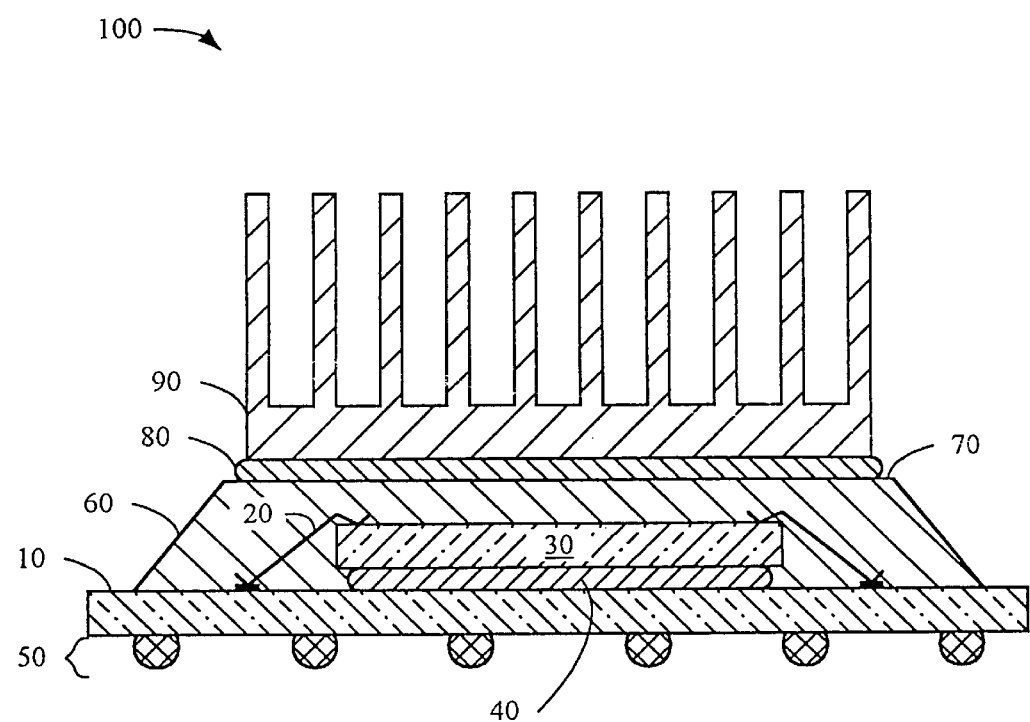
FIG. 1 is a cross-sectional view of an overmolded plastic ball grid array package with a heat sink bonded thereto according to a preferred embodiment of the present invention.

According to a preferred embodiment of the present invention, a method for bonding is provided comprising the steps of: (a) exposing to a plasma a surface of a molded polymer formed on a substrate; (b) allowing the plasma to at least partially convert silicon-containing residue on the surface to silica; and (c) bonding an article to the surface by applying an adherent between the article and the surface. Preferably, the silicon-containing residue is silicone oil and the plasma is an oxygen plasma. Also, preferably the adherent is selected from either a heat cured silicone-based paste adhesive with a metal oxide filler or a heat cured porous polymer film impregnated with adhesive. More preferably, the film is polytetrafluoroethylene (PTFE), the adhesive is polybutadine, and the film is further impregnated with a metal oxide heat transfer medium.

Also, a preferred embodiment of the present invention includes a method for bonding wherein the heat cured porous polymer film described above is used as the adherent without plasma treatment of the molded polymer surface. Thus, the molded polymer has a surface with silicon-containing residue thereon, but a bond between an article and the surface is still established by the film.

Also according to the preferred embodiment of the present invention, various apparatus with a unique structure will be produced by the methods described above. Specifically, one preferred embodiment is an apparatus comprising a molded polymer formed on a substrate, a silica layer on a surface of the molded polymer, adherent bonded to the silica layer, and an article bonded to the adherent. Such an apparatus will result from a method including plasma treatment of the silicon-containing residue on the polymer surface. Also, a preferred embodiment of present invention provides an apparatus comprising a molded polymer formed on a substrate, silicon-containing residue on a surface of the molded polymer, adherent bonded to the surface, and an article bonded to the adherent. Such is the type of apparatus that results when a method described above is used that does not include plasma treatment of the molded polymer surface.

The need for the present invention arises from difficulty in uniformly bonding heat sinks to the encapsulants commonly used to package electronic components. To encourage the release of encapsulated components from a mold, silicone oil or other mold release compounds are frequently included in the polymer encapsulant. Since such mold release compounds encourage release from the mold, they also often prevent a secure adhesive bond between the encapsulant and a heat sink. The problem is that the surface to be bonded to a heat sink must either be silicone free or the adhesive must be able to nevertheless bond with the encapsulant. This problem has previously been encountered in the production of plastic ball grid array (PBGA) packages, in particular, PBGA packages with an overmold covering electronic components mounted on the PBGA. Essentially, the silicone oil in the overmold prevented the adherence of a room temperature curing two part adhesive that was intended to bond a heat sink to the overmold. Accordingly, the preferred embodiments summarized above either provide a silicon-free bonding surface or create a bond despite the presence of silicone oil. The preferred embodiments are discussed in more detail below.

Referring to FIG. 1, a plastic ball grid array (PBGA) package 100 is shown. PBGA package 100 includes a semiconductor device 30 mechanically connected to a laminate 10 by a laminate adherent 40 and electrically connected to laminate 10 by a device interconnect 20. Laminate 10 additionally includes a ball grid 50 used to connect PBGA package 100 electrically and/or mechanically to other devices, for example, to a printed circuit board (not shown). Also shown in FIG. 1 is overmold 60, a molded polymer formed over semiconductor device 30 and device interconnect 20 by transfer molding. A heat sink 90 is in turn mechanically connected to overmold 60 by overmold adherent 80 placed on overmold surface 70. Provided that overmold adherent 80 is at least partially heat conductive, rather than heat insulative, heat generated by semiconductor device 30 will be conducted to heat sink 90 and dissipated to the surroundings of PBGA package 100. Even though FIG. 1 shows PBGA package 100 with heat sink 90 bonded thereto by overmold adherent 80, it should be noted that the present invention is applicable to other packages, as well as articles that may need bonding to such other packages. In particular, the present invention is applicable to bonding any article to the surface of a molded polymer, wherein a silicon-containing residue on the surface of the molded polymer prevents forming a heat conductive, uniform bond between the article and the surface.

Accordingly, a preferred embodiment of the present invention provides a method whereby the interference of silicone oil or other silicon-containing residues may be overcome in forming a heat conductive bond between a molded polymer and an article, for example, a heat sink. Once the package is formed, such as PBGA package 100, the first step is to expose overmold surface 70, or another bonding surface, to a plasma. Next, the plasma conditions are maintained for a sufficiently long time to convert to silica any silicone oil or other silicon-containing residue on the surface that will interfere with bonding. Preferably, the plasma is an oxygen plasma and more preferably, the oxygen plasma is maintained for about 3 minutes in a reactive ion etch (RIE) chamber, or equivalent. A suitable plasma will be produced by establishing a pressure of about 0.35 torr in the RIE chamber with an oxygen flow rate of about 750 standard cubic centimeters/minute (sccm) while delivering about 300 watts of generator power. The type of plasma and plasma conditions selected may vary depending upon the particular silicon-containing residue and the type of polymer used for the molded polymer, as well other factors. However, the proper conditions can be quickly determined through trial plasma exposures followed by visual analysis of the treated surface by scanning electron microscope (SEM). By comparing the surface topography prior to treatment and after treatment, one of ordinary skill in the art can determine when a topography change has occurred indicating conversion of the surface residue to silica. Silica is a glass derivative that will exhibit a different texture or topography compared to a polymer material used in a typical electrical component encapsulant. Specifically, the topography changes from a surface that appears relatively smooth at a magnification of about 5000X to a surface that appears much more rough in texture. Once the needed conversion has taken place, bonding of an article to the surface may occur by applying an adherent between the article and the surface. Depending upon the type of adherent selected, additional temperature or pressure may be required to complete the bonding step.

For example, the types of adherents that are best for bonding heat sinks to electronic component packages require heat curing. According to a preferred embodiment of the present invention, such heat curing occurs by preferentially driving heat through the article, for example, heat sink 90, to avoid exposing the electrical component or other substrate within the molded polymer to the temperature needed for curing. Because heat sink 90 is made from a heat conductive material, heat applied exclusively to the heat sink 90 will be absorbed therein and conducted to the adherent, such as laminate adherent 40 shown in FIG. 1, thus curing the adherent. By preferentially driving heat through heat sink 90, heat exposure of semiconductor device 30 can be diminished below the point wherein permanent damage may occur.

One type of adherent according to a preferred embodiment of the present invention is a silicone-based paste adhesive with a metal oxide filler. Such a silicone-based adherent is preferred because it is believed that the silicone in the adhesive interacts with the silica formed on the overmold surface 70, or other treated surface, to produce a stronger bond between heat sink 90 and overmold surface 70. The metal oxide filler or, more preferably, alumina filler improves the heat conductivity of overmold adherent 80, such that heat is adequately conveyed from semiconductor device 30 to heat sink 90. One suitable adhesive is 1-4373, available from Dow Corning in Corning, N.Y., which is preferably cured at a temperature of about 130 to 160 degrees Celsius (° C.), or more preferably 150° C., for about 30 to 80 minutes (min), or more preferably 60 min, without applying any pressure. Prior to curing, an initial placement pressure of about 1 to 3 pounds per square inch (psi) is applied for about 1 to 60 seconds (sec), or more preferably 10 sec, to squeeze out excess adhesive between overmold surface 70 and heatsink 90. Other adhesives known to those skilled in the art may also be in keeping with the above criteria, but may have different curing conditions.

For some applications, it may be advisable to bake out moisture from overmold 60 before adhering heat sink 90, otherwise, moisture may escape from overmold 60 while curing and form steam pockets in overmold adherent 80. The moisture bake out typically occurs at a temperature below the curing temperature for a period of several minutes, depending on the particular material from which overmold 60, or another encapsulant, is formed. For example, moisture will be suitably baked out at 125° C. applied for about 1 hour. Even though it may be advisable in some applications to eliminate steam pockets in overmold adherent 80, it may be more advisable to avoid exposing semiconductor device 30 to heat. Some heat exposure will generally be required to cure overmold adherent 80, however, it is often advisable to minimize heat exposure by eliminating steps such as a moisture bake out if possible.

Alternative to the plasma surface treatment described above, another preferred embodiment of the present invention provides a method for bonding wherein no plasma treatment is required. Such a preferred method begins with providing a molded polymer formed on substrate, wherein the molded polymer has a surface with silicon-containing residue thereon. Exemplary molded polymers include overmold 60 shown in FIG. 1 and common silicon-containing residues include silicone oil typically used to produce overmold 60. Next, bonding of an article to the surface, such as overmold surface 70, occurs by applying a porous polymer film between the article and the surface, wherein the film is impregnated with adhesive. Any adhesive known to those skilled in the art may be used that is consistent with the features and advantages of the invention described herein. Formation of the bond is completed with the step of heat curing the film and, preferably, applying pressure during the heat curing. Typically, a film adhesive could not be used to bond heat sink 90 to overmold surface 70 because air becomes trapped between the film adhesive and overmold 70 or heat sink 90 during application of the film. The air pockets create multiple problems in such an electronic component package. First, the air pockets compromise the heat conducting path between semiconductor device 30 and heat sink 90 since air is a poor heat conductor. In addition, the presence of the air pockets prevents formation of a uniform bond between overmold surface 70 and heat sink 90. Thus, the strength of the mechanical attachment is also compromised and failure of the attachment between heat sink 90 and overmold surface 70 is likely to be accelerated.

According to a preferred embodiment of the present invention particular components for a porous polymer film have been developed that form a more preferred bond with a molded polymer having silicone oil residue on its surface. The more preferred film is made from polytetrafluoroethylene (PTFE) impregnated with polybutadine and a metal oxide heat transfer medium. Most preferably, the heat transfer medium is zincoxide. Testing has shown that such a PTFE film can be bonded at 140 to 160° C. by applying a pressure of 50 to 500 psi in a bonding cycle of less than 10 sec for a tack cure, followed by a full cure at the same temperature and pressure for about 10 to 60 min. Notably, a tack cure is not required in all applications, but is an optional step to position heatsink 90 prior to full cure. When heat sink 90 is made from anodized or chromated aluminum the bond thus formed will exhibit greater than 300 psi lap sheer strength and may go as high as 800 psi. In fact, when high bonding conditions are used, that is, pressure between 500 to 1,000 psi and a bonding cycle of greater of than ten minutes, the bond strength between heat sink 90 and overmold surface 70 is stronger than the bond strength between overmold 60 and laminate 10. Accordingly, heat sink 90 will remain attached in conditions so extreme as to cause overmold 60 to break free from laminate 10. Even though a method including a porous polymer film as adherent 70 does not require plasma treatment of overmold surface 70, plasma treatment may nevertheless occur prior to applying the film between heat sink 90 and overmold surface 70. The treatment steps are essentially the same as those described above except it is possible that lower pressure and shorter bonding time may be used to complete the bond.

The film used in a preferred embodiment of the present invention is advantageous over conventional films in that it is porous and thus provides lateral dispersion of any air pockets that develop between heat sink 90 and the film or between the film and overmold surface 70 during application of the film between heat sink 90 and overmold surface 70. Because any trapped air pockets in overmold adherent 80 may laterally disperse during processing, a uniform bond will be formed and the potential heat conductance of overmold adherent 80 will not be compromised. In addition, the mechanical strength of the bond will achieve its maximum potential since few, if any, air pockets will be present to compromise the mechanical strength. The most preferred form of PTFE film to provide this characteristic is essentially a film that, on the microscopic level, has the appearance of a sponge, wherein the webs in such micro sponge are about one micrometer in diameter or slightly larger. A suitable porous polymer film is available from W. L. Gore & Associates in Newark, Del. called Gore No. 1308 and is impregnated with approximately ten to fifty weight percent polybutadine. Even though it is not necessary to plasma treat overmold surface 70 when using porous polymer film as described above, plasma treatment may nevertheless be applied prior to applying the film between heat sink 90 and overmold surface 70. Accordingly, there are two preferred adherents that may used according to the present invention following plasma treatment to convert silicon-containing residues to silica. Alternatively, another overmold adherent 80 may also be used that is in keeping with the criteria described above.

When the described methods are used, unique apparatus according to a preferred embodiment of the present invention will be produced thereby. When the plasma treatment embodiment is used, a silica layer will exist on overmold surface 70. Such a silica layer helps provide an adequate surface for bonding of overmold adherent 80. In particular, when overmold adherent 80 comprises a silicone-based paste adhesive it is believed that the silicone in the adhesive interacts with the silica layer on overmold surface 70 to improve bond strength.

Nevertheless, when plasma treatment is not used, and instead a porous polymer film as described above is used, a unique structure is also present. In particular, a silicon containing residue exists on overmold surface 70, and yet the porous polymer film is securely bonded to overmold 60. In conventional packages, the presence of silicon-containing residue, especially silicone oil, generally precludes existence of a bond between heat sink 90 and overmold surface 70, except in the case wherein mechanical devices, such as clips and rivets, are used to attach heat sink 90. Even if adhesives could be developed for films that will bond to such a silicon-containing surface, air pockets would exist between the surfaces and compromise bond strength and heat conductivity. However, because the more preferred film is porous and provides lateral dispersion of air pockets, an adequately strong and heat conductive bond may be formed. The heat conductivity is further enhanced by the presence of a zinc oxide heat transfer medium impregnated in the film.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation. For example, it will be understood that, while various of the conductors (connections) are shown in the drawing as single lines, they are not so shown in a limiting sense, and may comprise plural conductor (connections), as is understood in the art.

We claim:

1. An apparatus, comprising:
    a molded polymer formed on a substrate, wherein the molded polymer comprises an overmold;
    silicon-containing residue on a surface of the overmold;
    an adherent material bonded to the surface of the overmold; and
    an article bonded to the adherent material, wherein the article comprises a heat sink, and wherein a bond strength between the heat sink and the surface of the overmold is greater than a bond strength between the overmold and the substrate.

2. The apparatus of claim 1, wherein the substrate comprises an electronic component.

3. The apparatus of claim 1, wherein the adherent material comprises a porous polymer film impregnated with epoxy adhesive.

4. The apparatus of claim 3, wherein silicon-containing residue comprises silicone oil, the film comprises polytetrafluoroethylene, the adhesive comprises polybutadine, and the film is further impregnated with a metal oxide heat transfer medium.

5. The apparatus of claim 4, wherein the metal oxide heat transfer medium comprises zinc oxide.

6. The apparatus of claim 1, wherein the heat sink comprises anodized.

7. The apparatus of claim 1, wherein the heat sink comprises chromated aluminum.

8. The apparatus of claim 6, wherein a bond formed between the heat sink and the overmold comprises a lap sheer strength between about 300 psi to about 800 psi.

* * * * *